United States Patent
Diep et al.

(10) Patent No.: US 12,300,322 B2
(45) Date of Patent: May 13, 2025

(54) SELECTIVE INCREASE AND DECREASE TO PASS VOLTAGES FOR PROGRAMMING A MEMORY DEVICE

(71) Applicant: Micron Technology, Inc., Boise, ID (US)

(72) Inventors: Vinh Quang Diep, Hayward, CA (US); Jeffrey Ming-Hung Tsai, San Jose, CA (US); Ching-Huang Lu, San Jose, CA (US); Yingda Dong, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 198 days.

(21) Appl. No.: 18/103,978

(22) Filed: Jan. 31, 2023

(65) Prior Publication Data
US 2023/0268003 A1    Aug. 24, 2023

Related U.S. Application Data

(60) Provisional application No. 63/313,358, filed on Feb. 24, 2022.

(51) Int. Cl.
*G11C 16/00* (2006.01)
*G11C 16/04* (2006.01)
(Continued)

(52) U.S. Cl.
CPC .......... *G11C 16/10* (2013.01); *G11C 16/0483* (2013.01); *G11C 16/08* (2013.01); *G11C 16/3459* (2013.01)

(58) Field of Classification Search
CPC .... G11C 2029/1202; G11C 2211/5641; G11C 29/025; G11C 29/42; G11C 29/44; G11C 29/50012; G11C 16/32; G11C 16/3495; G11C 2211/5646; G11C 29/00; G11C 5/143; G11C 5/147; G11C 7/04; G11C 16/02; G11C 16/0466; G11C 16/12; G11C 16/14; G11C 16/3404; G11C 16/344; G11C 16/349; G11C 2211/562; G11C 5/02; G11C 5/14; G11C 7/1006; H10B 41/27; H10B 43/27; H10B 43/30; H10B 43/40; H01L 2224/04026; H01L 2224/0557; H01L 2224/08145; H01L 2224/08146; H01L 2224/13025; H01L 2224/13147; H01L 2224/16145; H01L 2224/16146;
(Continued)

(56) References Cited

U.S. PATENT DOCUMENTS 10,249,382 B2 *   4/2019   Lee .................... G11C 29/025

\* cited by examiner

*Primary Examiner* — Thong Q Le
(74) *Attorney, Agent, or Firm* — Lowenstein Sandler LLP

(57) ABSTRACT

A memory device comprising a memory array and control logic operatively coupled with the memory array. The control logic is to: detect a program operation directed at a selected wordline of multiple wordlines of the memory array; determine, during an initial phase of the program operation, whether a program voltage being applied to the selected wordline satisfies a threshold program voltage; add, in response to the program voltage not satisfying the threshold program voltage, a base offset voltage to an initial pass voltage to generate a higher pass voltage, the initial pass voltage being a percentage of an initial program voltage; and cause the higher pass voltage to be applied to a remainder of the multiple wordlines other than the selected wordline.

20 Claims, 11 Drawing Sheets

(51) Int. Cl.
  *G11C 16/08* (2006.01)
  *G11C 16/10* (2006.01)
  *G11C 16/34* (2006.01)

(58) Field of Classification Search
  CPC ... H01L 2224/2919; H01L 2224/32145; H01L 2224/33181; H01L 2224/48091; H01L 2224/48105; H01L 2224/48145; H01L 2224/48147; H01L 2224/48227; H01L 2224/73204; H01L 2224/73215; H01L 2224/73253; H01L 2224/73257; H01L 2224/73265; H01L 2225/06506; H01L 2225/0651; H01L 2225/06513; H01L 2225/06517; H01L 2225/06541; H01L 2225/06558; H01L 2225/06562; H01L 2225/06565; H01L 24/08; H01L 24/16; H01L 25/0657; H01L 25/18; H01L 29/788
  See application file for complete search history.

SELECTIVE INCREASE AND DECREASE TO PASS VOLTAGES FOR PROGRAMMING A MEMORY DEVICE

REFERENCE TO RELATED APPLICATION

This application claims the benefit of U.S. Provisional Patent Application No. 63/313,358, filed Feb. 24, 2022, the entirety of which is incorporated herein by reference.

TECHNICAL FIELD

Embodiments of the disclosure relate generally to memory sub-systems, and more specifically, relate to selective increase and decrease to pass voltages for programing a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
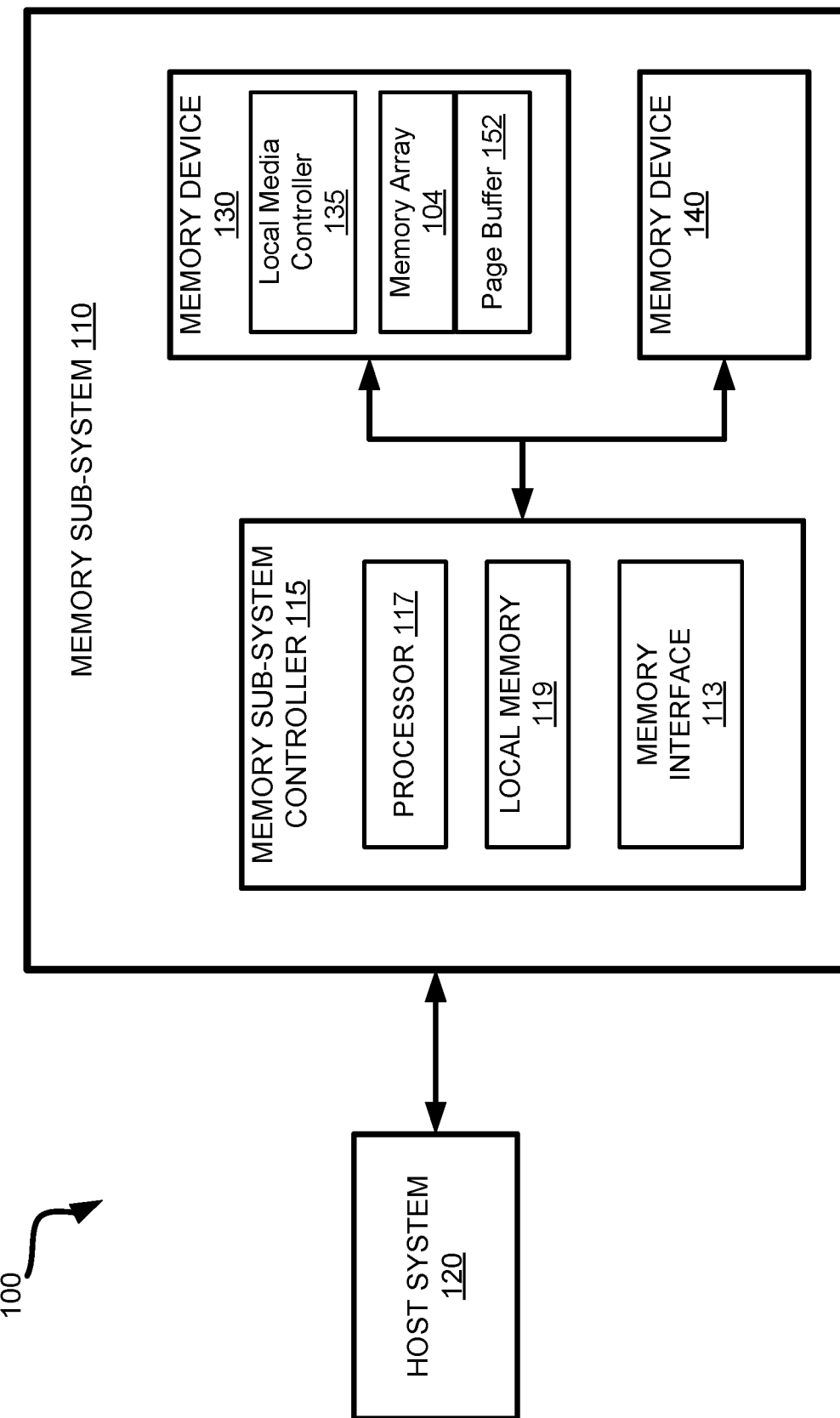
FIG. 1A illustrates an example computing system that includes a memory sub-system in accordance with some embodiments of the present disclosure.

Aspects of the present disclosure are directed to selective increase and decrease to pass voltages for programming a memory device of a memory sub-system. A memory sub-system can be a storage device, a memory module, or a hybrid of a storage device and memory module. Examples of storage devices and memory modules are described below in conjunction with FIG. 1A. A host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, negative AND (NAND) memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. A data block hereinafter refers to a unit of the memory device used to store data and can include a group of memory cells, a word line group, a word line, or individual memory cells. Each data block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory (e.g., "memory array"). The compact nature of certain non-volatile memory devices, such as 3D flash NAND memory, means word lines are common to many memory cells within a block of memory.

During a programming operation, selected memory cell(s) can be programmed with the application of a programming voltage to a selected word line. Due to the word line being common to multiple memory cells, unselected memory cells can be subject to the same programming voltage as the selected memory cell(s). If not otherwise preconditioned, the unselected memory cells can experience effects from the programming voltage on the common word line. These programming voltage effects can include the condition of charge being stored in the unselected memory cells which are expected to maintain stored data. This programming voltage effect is termed a "programming disturbance" or "program disturb" effect. The program disturb effect can render the charge stored in the unselected memory cells unreadable altogether or, although still apparently readable, the contents of the memory cell can be read as a data value different than the intended data value stored before application of the programming voltage.

The presence of residue electrons, such as electrons trapped or otherwise remaining on a charge storage structure after an earlier operation (e.g., a program verify operation), can contribute to the program disturb effect. At the end of a program verify operation, for example, a pass voltage (Vpass) applied to the word lines that are not being programmed ramps down and word lines on the source side having a high threshold voltage will cut off prior to word lines with a lower threshold voltage. Therefore, electrons will be trapped in the channel region (e.g., the pillar) of array transistors connected to the word lines with the lower threshold voltage (e.g., between the cut off word lines) and become residue electrons. Since the channel region (e.g., the pillar) in some non-volatile memory devices is a floating channel that may not be connected to a bulk grounded body, there is generally no path for residual electrons in the channel region to discharge other than towards the source of the memory string.

These residue electrons can contribute to program disturb in a number of ways. Regular data word lines (e.g., word lines lower down the string) can suffer from hot-electron ("hot-e") disturb where a large voltage differential between the gate and source causes the residue electrons to be injected from a drain depletion region into the floating gate. This hot-e disturb can permanently change switching characteristics of the transistor associated with the selected memory cell, which is an undesired outcome. Although electrons are referred to herein as causing hot-e disturb, holes can also cause hot-e disturb in other cases, and thus, this disclosure is equally applicable to preventing hot-e disturb from injecting holes as well. In addition, the top few word lines in the string might suffer from insufficient boosting when the channel material of unselected memory cells is at a voltage sufficiently different than the programming voltage. This difference in voltage can initiate an electrostatic field of sufficient magnitude to change the charge on a word line and cause the contents of the memory cell to be programmed inadvertently or read incorrectly.

Aspects of the present disclosure address the above and other deficiencies by increasing the pass voltage on multiple wordlines of the memory array (other than the selected wordline) during the initial phase of an inhibit program operation. An "inhibit" program operation makes reference to applying voltages to wordlines that prevent (or "inhibit") connected memory cells from being programmed. Thus, the initial phase of an inhibit program is intended to move electrons out of the source side of the channel region of the memory array in a source-to-drain program operation and generally follows directly after a program verify operation having been performed on the memory array. By applying a higher pass voltage to the wordlines at the beginning of such a program operation (e.g., during the initial phase), any residue electrons (or holes) can be forced out of the source side of the channel region before the program voltage applied to the selected wordline is sufficiently increased to a level that would cause hot-e injection. This solution may be applicable to both source-to-drain and drain-to-source program operations of the memory array.

More specifically, control logic located on a memory device that is coupled with the memory array can perform some additional operations to mitigate the hot-e disturb. These operations can include, for example, detecting a program operation directed at a selected wordline of multiple wordlines of the memory array and determining, during an initial phase of the program operation, whether a program voltage being applied to the selected wordline satisfies a threshold program voltage. In at least some embodiments, this threshold voltage is between 20-50% of a maximum program voltage to eventually be applied to the selected wordline, as may be pre-designed or configured after manufacturing, for example. The operations can further include, in response to the program voltage not satisfying the threshold program voltage, adding a base offset voltage to an initial pass voltage to generate a higher pass voltage. In at least some embodiments, the initial pass voltage is a percentage of an initial program voltage, and thus, the higher pass voltage is greater than this percentage of the initial program voltage. The operation can further include causing the higher pass voltage to be applied to a remainder of the multiple wordlines other than the selected wordline.

In these embodiments, as programming continues, the programming voltage increases until surpassing the threshold program voltage. Further, the higher pass voltage grows at a first increase rate during this initial phase. In at least some embodiments, the operations performed by the control logic further include detecting, during programming associated with the selected wordline, that the program voltage satisfies the threshold program voltage. The operations can further include causing, in response to the detecting, the higher pass voltage to be reduced to a lower pass voltage, e.g., which is the initial pass voltage growing at a second increase rate. In some embodiments, the first increase rate is different than the second increase rate. For example the first increase rate can be zero while the second increase rate is positive, or the first increase rate can be lower than the second increase rate.

Advantages of this approach include, but are not limited to, mitigation or prevention of hot-e injection and disturb associated with an inhibit program operation performed on a memory array after that memory array has undergone a previous program verify operation. Further, by reducing the pass voltages on the unselected wordlines after the initial increase to the higher pass voltage, the pass voltages do not reach a maximum pass voltage too early, thus preventing degradation (e.g., narrowing) of a read margin (E0) between a first voltage distribution and a first read level as a result of programming the selected memory cell. Additional advantages would be apparent to one skilled in the art in possession of the following disclosure.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

The memory device 130 can be made up of bits arranged in a two-dimensional or three-dimensional grid, also referred to as a memory array. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO- DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device. Memory device 130, for example, can represent a single die or multiple dice having some control logic (e.g., local media controller 135) embodied thereon. In some embodiments, one or more components of the memory sub-system 110 are omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In some embodiments, memory device 130 includes the local media controller 135, a memory array 104, and a page buffer 152 coupled with the memory array 104. The local media controller 135, also referred to as control logic herein, can direct the amount and timing of the increases and decreases to the pass voltages during various programming operations as described in detail herein, e.g., to mitigate hot-e disturb. In some embodiments, the page buffer 152 provides the circuitry used to program data to the memory cells of the memory device 130 and to read the data out of the memory cells. This circuitry includes, for example, a number of latches for buffering data. In some embodiments, this control logic is integrated in whole or in part within the memory sub-system controller 115 and/or the host system 120. Further details with regards to the operations of local media controller 135 are described below.

Figure 1B:
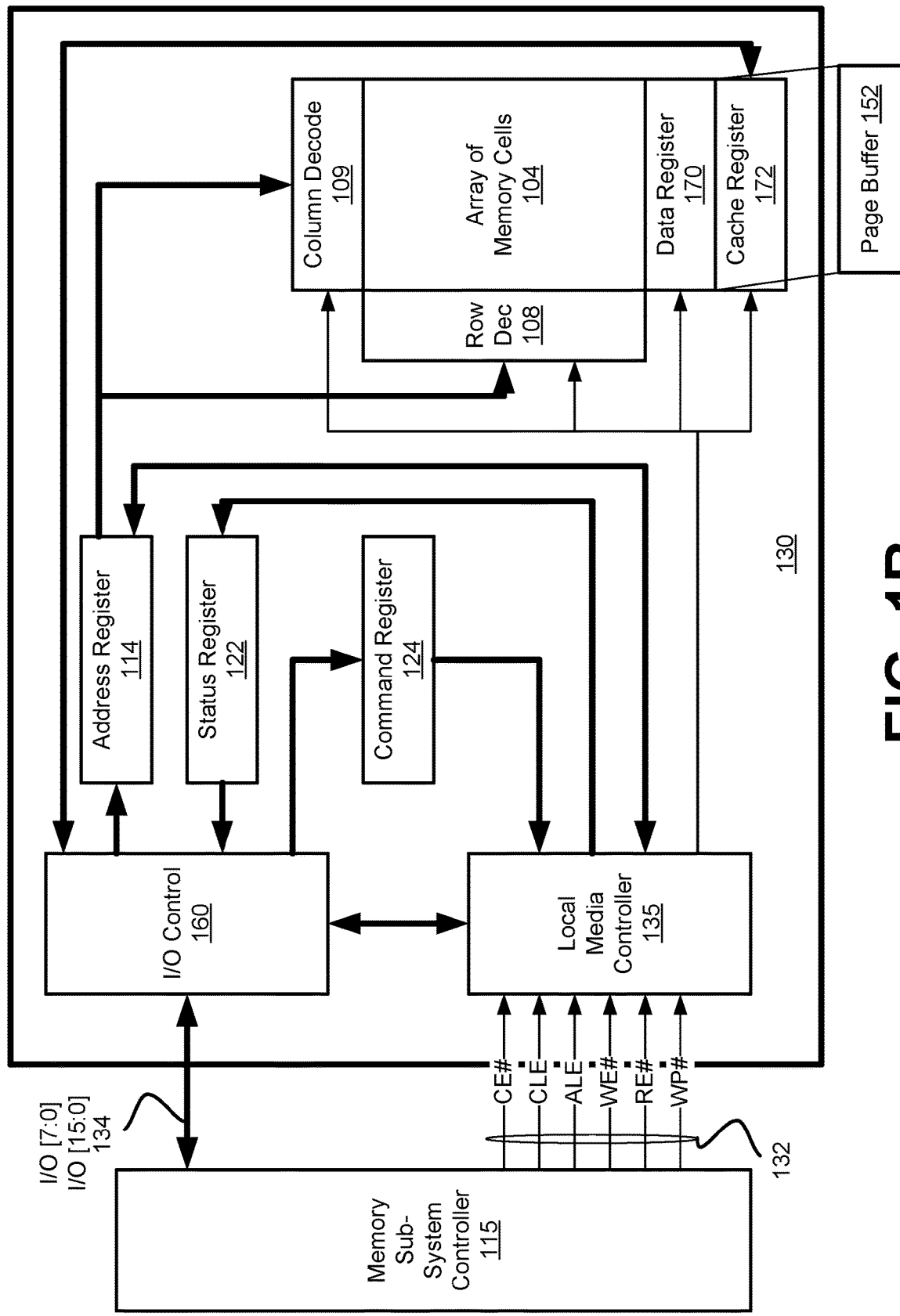
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In one embodiment, local media controller 135 can perform a ganged SLC verify operation to concurrently verify (i.e., at least partially overlapping in time) that memory cells in two separate sub-blocks of a block of memory array 104 were successfully programmed with data from two separate pages using a single sensing operation.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) the page buffer 152 of the memory device 130. The page buffer 152 may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
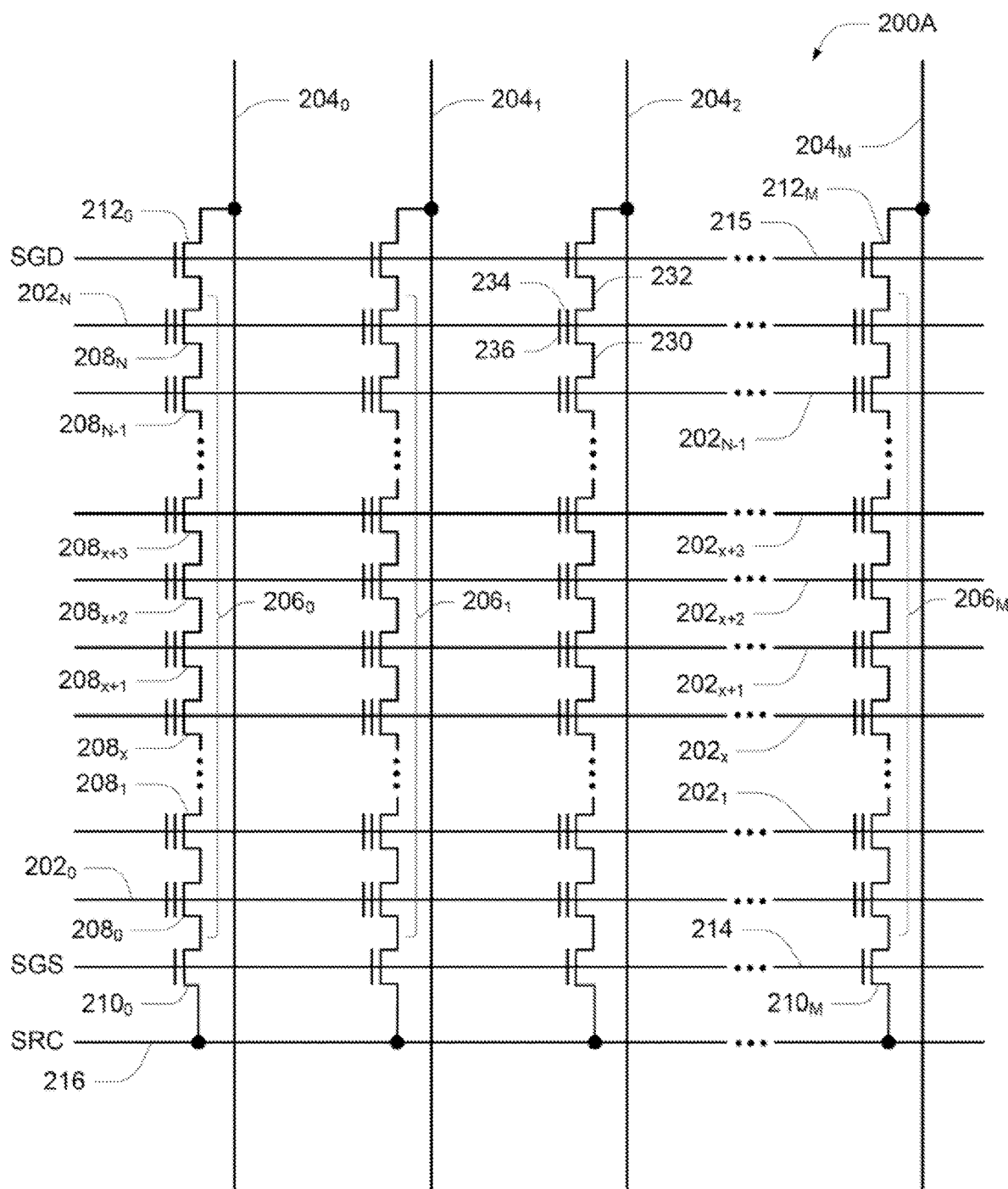
FIGS. 2A-2C are schematics of portions of an array of memory cells as could be used in a memory of the type described with reference to FIG. 1B according to an embodiment.
Figure 2B:
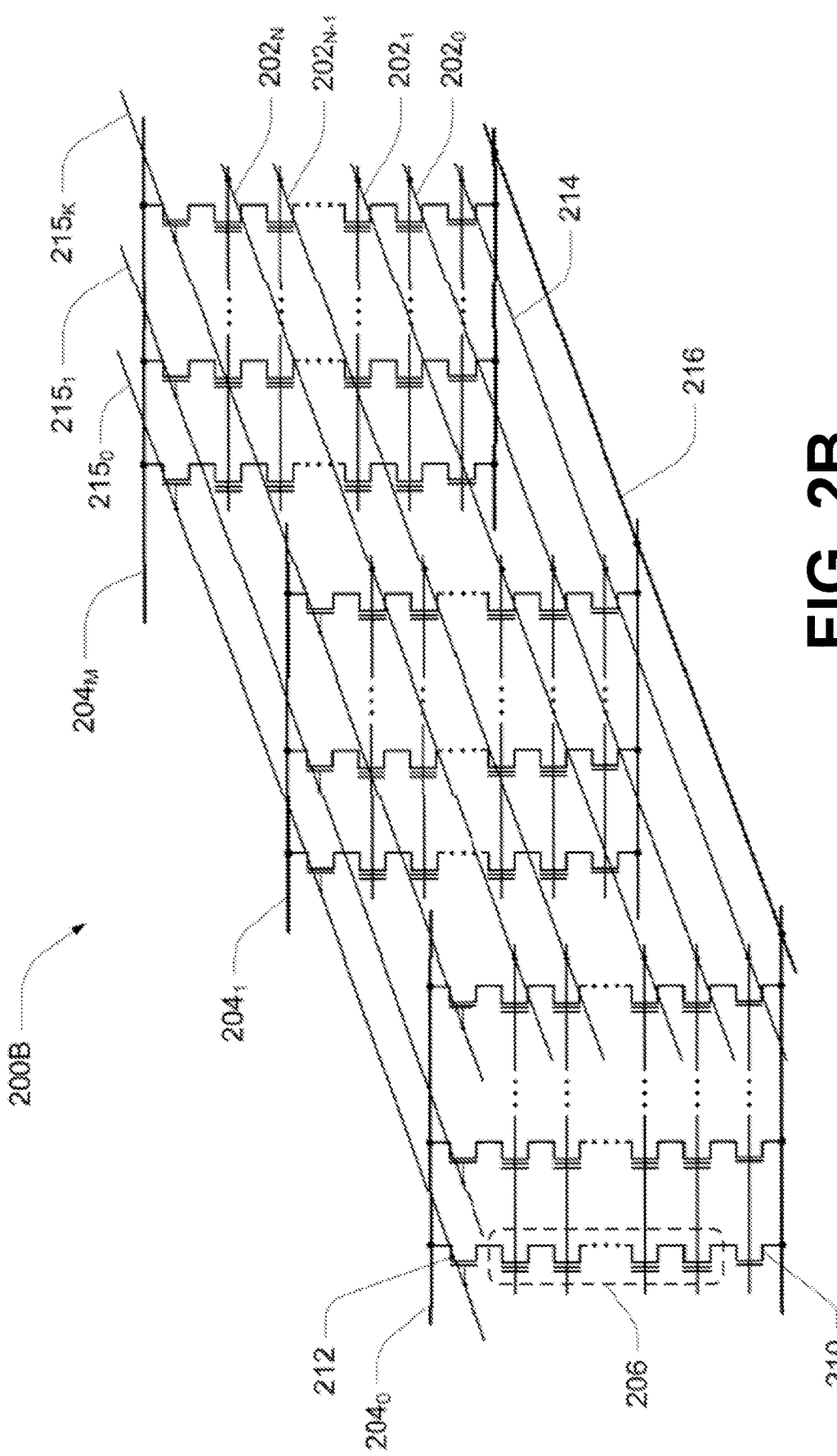
Figure 2C:
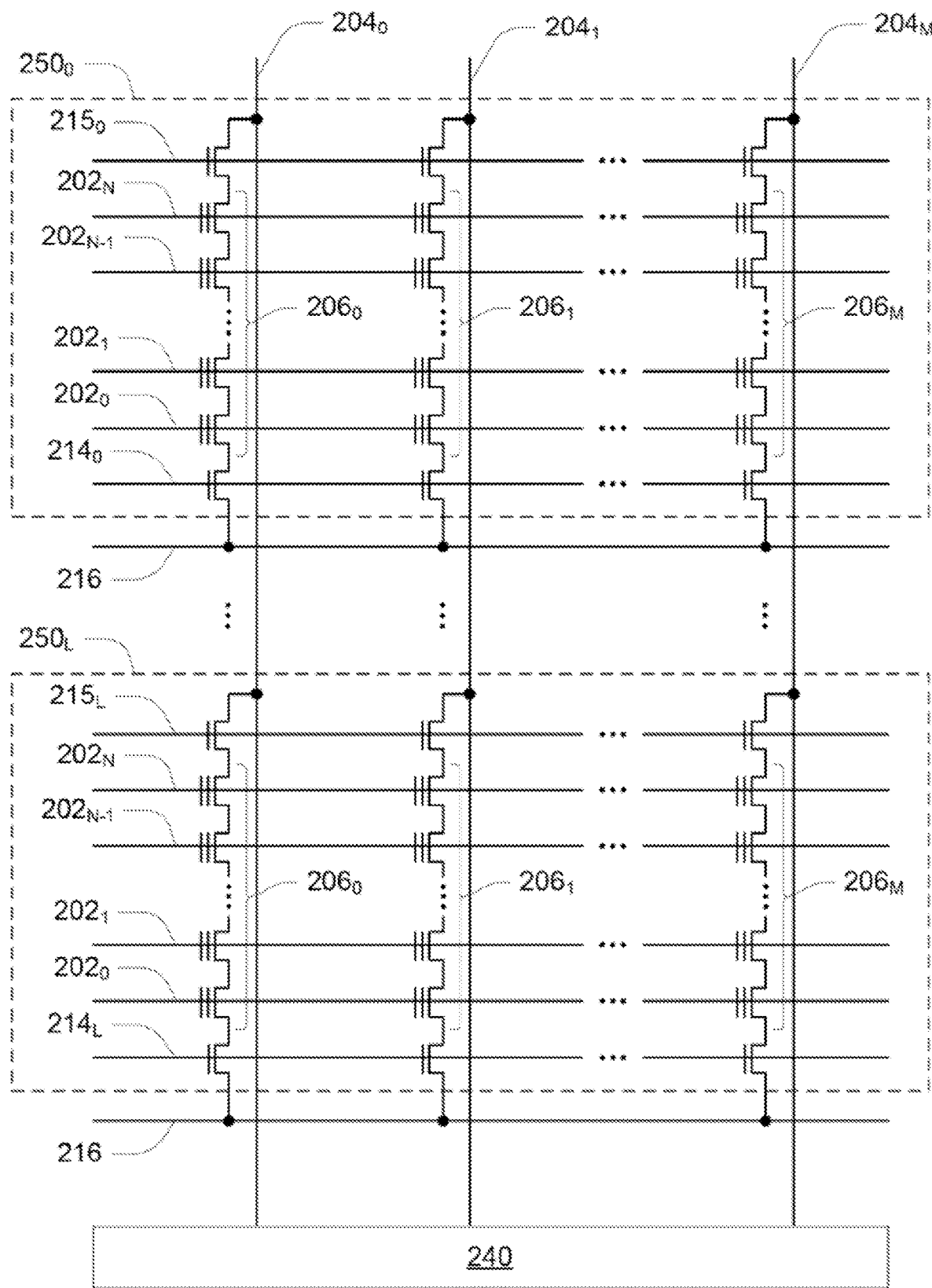

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

In some embodiments, the drain select line (SGD) and source select line (SGS) are separated and biased to different sources or to a commonly shared source. Further, the SGD and SGS lines can be ones of several layers of memory sub-blocks, each layer that can include various connections as explained above. Further, the common source 216 (SRC) can be a plate that can be fully or partially segmented or may be full connected.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 3A:
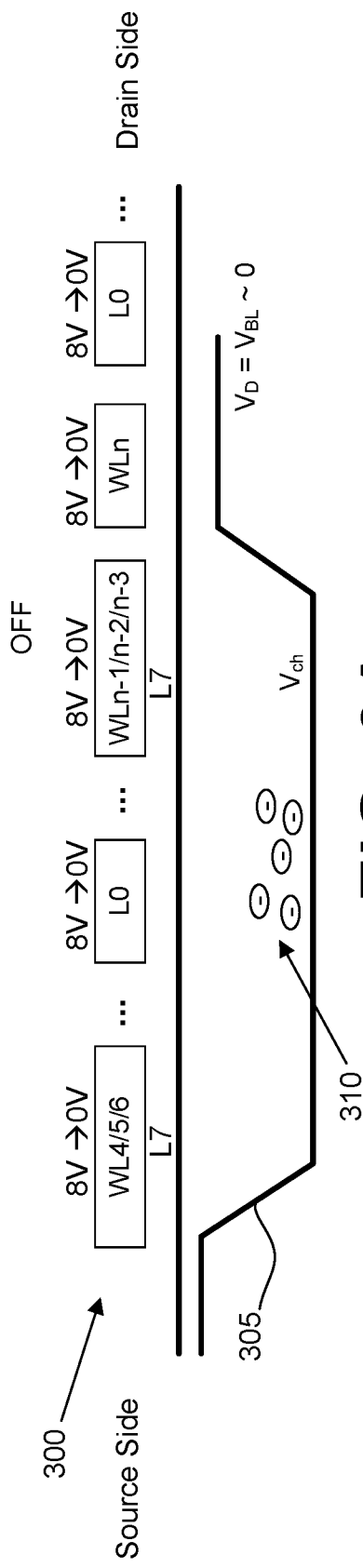
FIG. 3A is a schematic of a memory array and channel at the end of a program verify in accordance with some embodiments of the present disclosure.

FIG. 3A is a schematic of a memory array 300 and a channel 305 at the end of a program verify in accordance with some embodiments of the present disclosure. To turn off the wordlines (WL) at the end of the program verify, the wordline voltages are taken from an asserted voltage (and example of which is illustrated as 8V) to an approximately zero voltage ("0V"). Because the threshold voltages (Vt) of the memory cell transistors below the selected memory cell can be high while concurrently applying a zero bias to the wordlines, a variation in voltage across the channel 305 can often cause residual electrons 310 to be trapped inside the channel 305 at the end of the program verify operation.

Figure 3B:
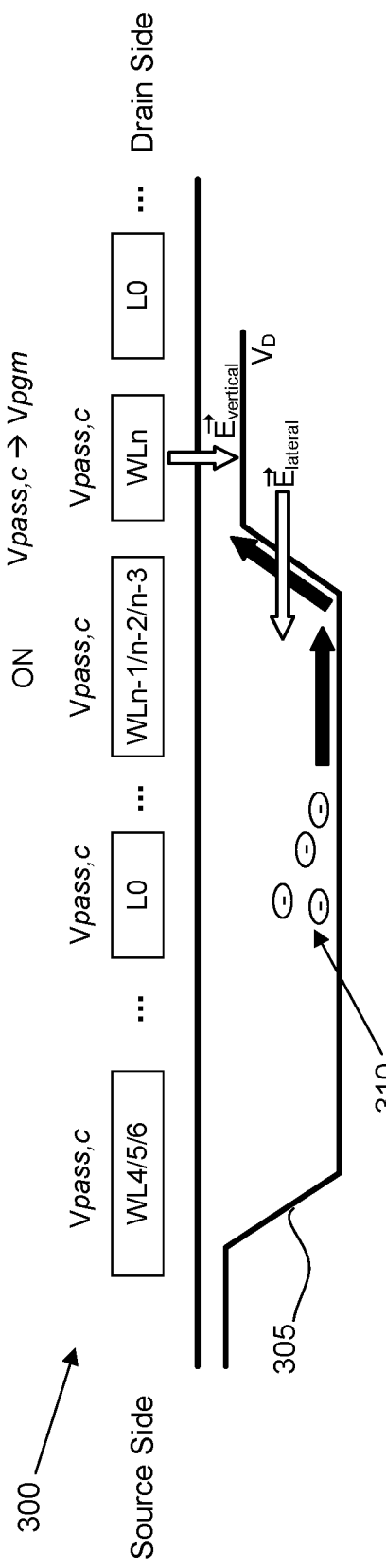
FIG. 3B is a schematic of a memory array and channel during a pass voltage and a program voltage ramp up in accordance with some embodiments of the present disclosure.

FIG. 3B is a schematic of the memory array 300 and the channel 305 during a pass voltage and a program voltage ramp up in accordance with some embodiments of the present disclosure. These trapped residual electrons 310 can cause hot-e injection/disturb at a gate of the selected wordline (WLn) during a program inhibit that is performed during an initial phase of a new program operation to the memory array. For example, the electrons 310 in the channel can be accelerated into the gate of a selected memory cell that is being programmed, causing hot carrier injection, also known as hot-e disturb. This acceleration is generally caused by a relatively strong vertical electric field generated by the increase in wordline voltage to the program voltage (Vpgm), which redirects the residual electrons from escaping to being injected at the gate of the selected memory cell. This hot-e disturb can permanently change switching characteristics of the transistor associated with the selected memory cell, an undesired outcome. The hot-e disturb issue can also be exacerbated at higher device temperatures. Although electrons are referred to herein as causing hot-e disturb, holes can also cause hot-e disturb in other cases, and thus, this disclosure is equally applicable to preventing hot-e disturb from injected holes as well.

Figure 4:
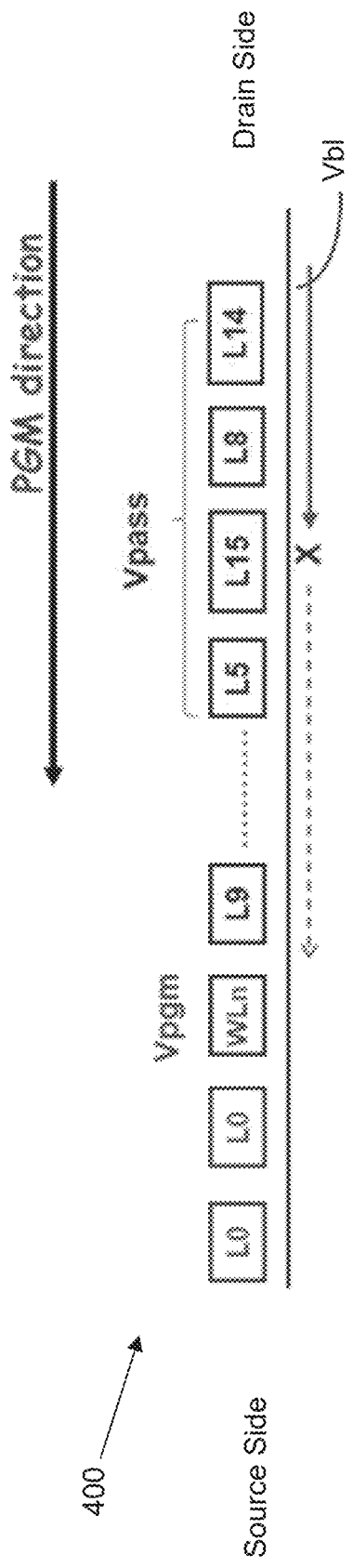
FIG. 4 is a diagram of a simplified example of drain-to-source programming of a selected wordline of multiple wordlines of a memory array in accordance with some embodiments of the present disclosure.

FIG. 4 is a diagram of a simplified example of drain-to-source programming of a selected wordline of multiple wordlines of a memory array 400 in accordance with some embodiments of the present disclosure. As illustrated, the pass voltage (Vpass) is applied to unselected wordlines to the drain side of the selected memory cell. As the Vpass voltage is applied to these wordlines, the channel is gradually turned on. A program voltage (Vpgm) is applied to the selected wordline (WLn) of the selected memory cell. The bitline voltage (Vbl) is illustrated as being applied to this memory array 400, e.g., which can be a string of memory cells as discussed with reference to FIGS. 2A-2C.

The X below the L15 memory cell illustrates how a lower Vpass voltage might cause the bitline voltage to not fully conduct down the channel, risking not being able to program the selected wordline (WLn). In such drain-to-source programming, a higher pass voltage at the beginning (or initial phase) of programming enables the source side to be fully conducted, thus facilitating the program of the selected wordline (WLn).

Figure 5:
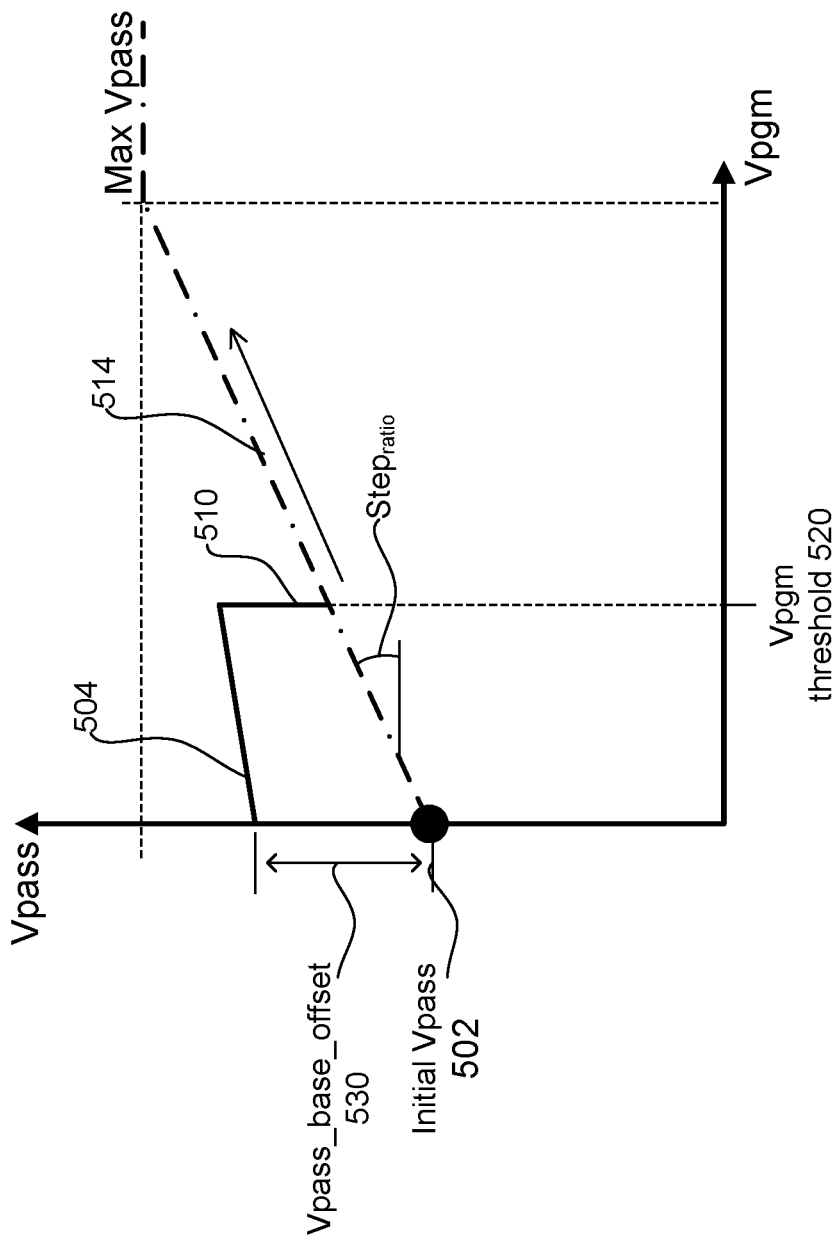
FIG. 5 is a graph of an example voltage ramp comparison between a pass voltage and a program voltage during a program operation in accordance with some embodiments.

FIG. 5 is a graph of an example voltage ramp comparison between a pass voltage and a program voltage during a program operation in accordance with some embodiments. Along the x-axis of the graph is illustrated a program voltage (Vpgm) applied to a selected wordline during an inhibit program operation. Along the y-axis is illustrated the pass voltage (Vpass) to be applied to the remainder of the multiple wordlines other than selected wordline. An initial pass voltage 502 is generally to be higher than the program voltage by a certain percentage, e.g., referred to as a pass voltage ratio ($Vpass_{ratio}$). Thus, the initial pass voltage 502 can be set as the start program voltage multiplied by the pass voltage ratio, or $Vpgm_{start}$*$Vpass_{ratio}$. A pass voltage 514 is illustrated that begins at this initial pass voltage level and grows (e.g., ramps) at an initial increase rate governed by a step ratio ($Step_{ratio}$).

According to at least some embodiments, the control logic, during an initial phase of the program operation, determines whether a program voltage being applied to the selected wordline satisfies a threshold program voltage 520. The difference in threshold program voltage and an initial program voltage (e.g., Vpgm threshold 520−Vpgm_start) can be set to between 20-50% of a difference between a maximum program voltage and the initial program voltage (e.g., Vpgm_max−Vpgm_start) to be applied to the selected wordline, which is also sometimes referred to as a target program voltage. The control logic can then add, in response to the program voltage not satisfying the threshold program voltage, a base offset voltage 530 to the initial pass voltage 502 to generate a higher pass voltage 504, the initial pass voltage being a percentage of an initial program voltage. Thus, as the program operation starts, the higher pass voltage 504, which is growing (or ramping) at a subsequent increase rate, is applied to a remainder of the multiple wordlines other than the selected wordline.

In at least some embodiments, as programming progresses, the control logic detects that the program voltage satisfies the threshold program voltage 520, e.g., has reached the threshold program voltage 520 at the selected wordline. In response, the control logic causes, in response to the detecting, the higher pass voltage to be reduced to a lower pass voltage, e.g., incurring a voltage drop 510 back down to the initial pass voltage 514, which is growing at the initial increase rate. In some embodiments, the subsequent increase rate is different than the initial increase rate. In at least one embodiment, the subsequent increase rate is zero while the initial increase rate is positive.

Figure 6:
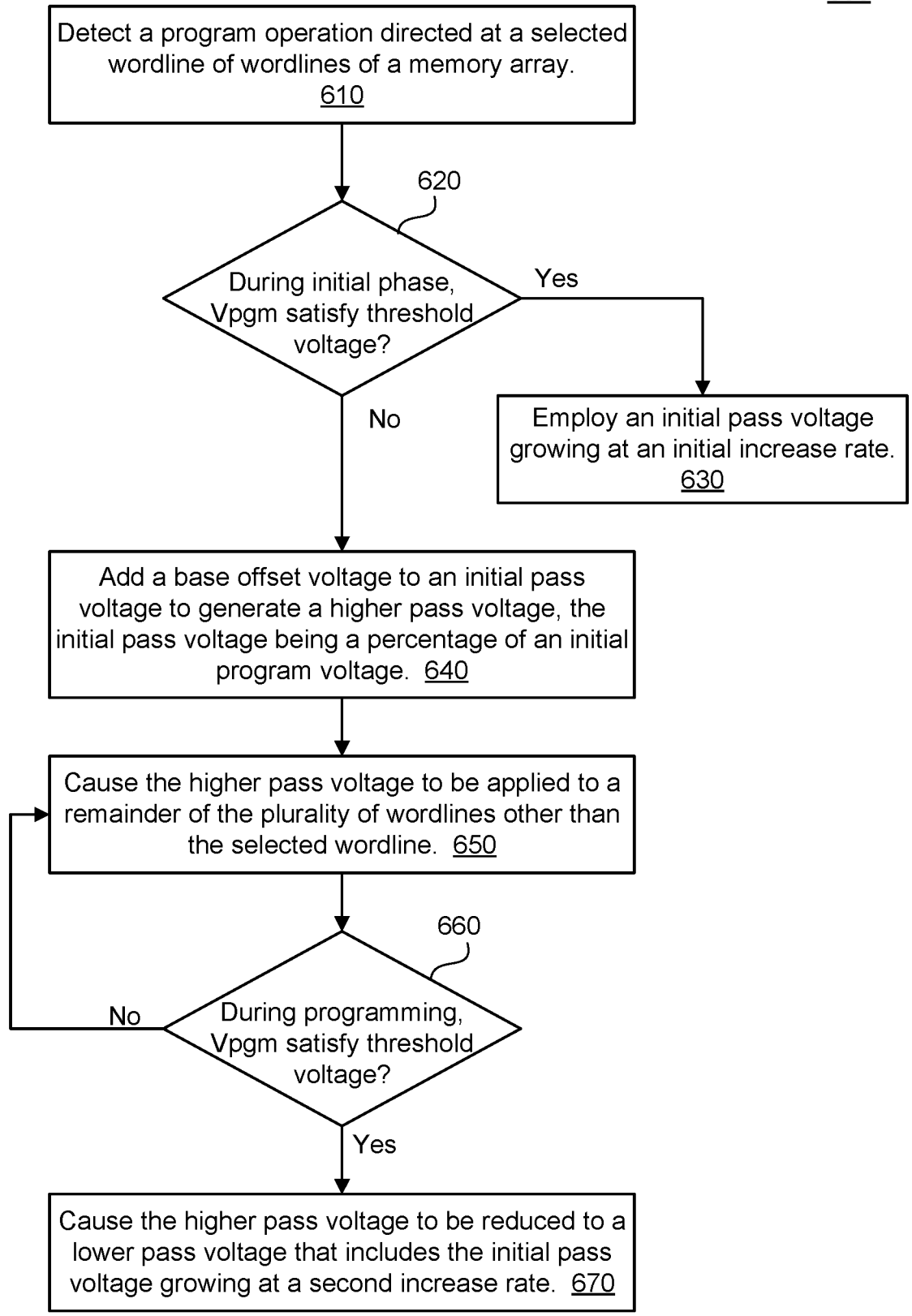
FIG. 6 is a flow diagram of an example method of selectively increasing a pass voltage during an initial phase of a program operation and decreasing the pass voltage later during the program operation in accordance with at least some embodiments.

FIG. 6 is a flow diagram of an example method 600 of selectively increasing a pass voltage during an initial phase of a program operation and decreasing the pass voltage later during the program operation in accordance with at least some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a program operation is detected. More specifically, the processing logic detects a program operation directed at a selected wordline of multiple wordlines of a memory array. For example, the selected wordline can be one of the wordlines $202_0$ to $202_N$ in the array of memory cells 200A (FIG. 2A) or the array of memory cells 200B (FIG. 2B).

At operation 620, a program voltage is checked. More specifically, the processing logic determines, during an initial phase of the program operation, whether the program voltage being applied to the selected wordline satisfies a threshold program voltage. In at least some embodiments, satisfying this threshold voltage includes a difference between the threshold program voltage and the initial program voltage reaching between 20-50% of a difference between a maximum program voltage and the initial program voltage to be applied to the selected wordline. If yes, the program voltage is satisfied, then at operation 630, the processing logic employs an initial pass voltage growing at an initial increase rate, and no offset voltage may be required.

If, however, the program voltage does not satisfy the threshold program voltage, at operation 640, a higher pass voltage is employed. More specifically, in response to the program voltage not satisfying the threshold program voltage at operation 620, the processing logic can add a base offset voltage to an initial pass voltage to generate a higher pass voltage, the initial pass voltage being a percentage of an initial program voltage applied to the selected wordline.

At operation 650, the higher pass voltage is applied. More specifically, the processing logic causes the higher pass voltage to be applied to a remainder of the multiple wordlines other than the selected wordline. This higher pass voltage can grow at a first increase rate. As described herein, the higher pass voltage encourages the exit of residual electrons in the channel of the memory array, thus mitigating against experiencing hot-e injection or disturb at the selected memory cell.

At operation 660, the program voltage is checked again. More specifically, the processing logic determines, during programming associated with the selected wordline, whether the program voltage satisfies the threshold program voltage. If no, then the processing logic loops back to operation 650 and continues to apply the higher pass voltage.

If, however, the program voltage does not satisfy the threshold program voltage, at operation 670, the higher pass voltage is reduced. More specifically, the processing logic causes, in response to detecting the program voltage satisfy the threshold program voltage, the higher pass voltage to be reduced to a lower pass voltage that is the initial pass voltage growing at a second increase rate. In at least some embodiment, the first increase rate is different than the second increase rate. In at least one embodiment, the first increase rate is zero and the second increase rate is positive.

Figure 7:
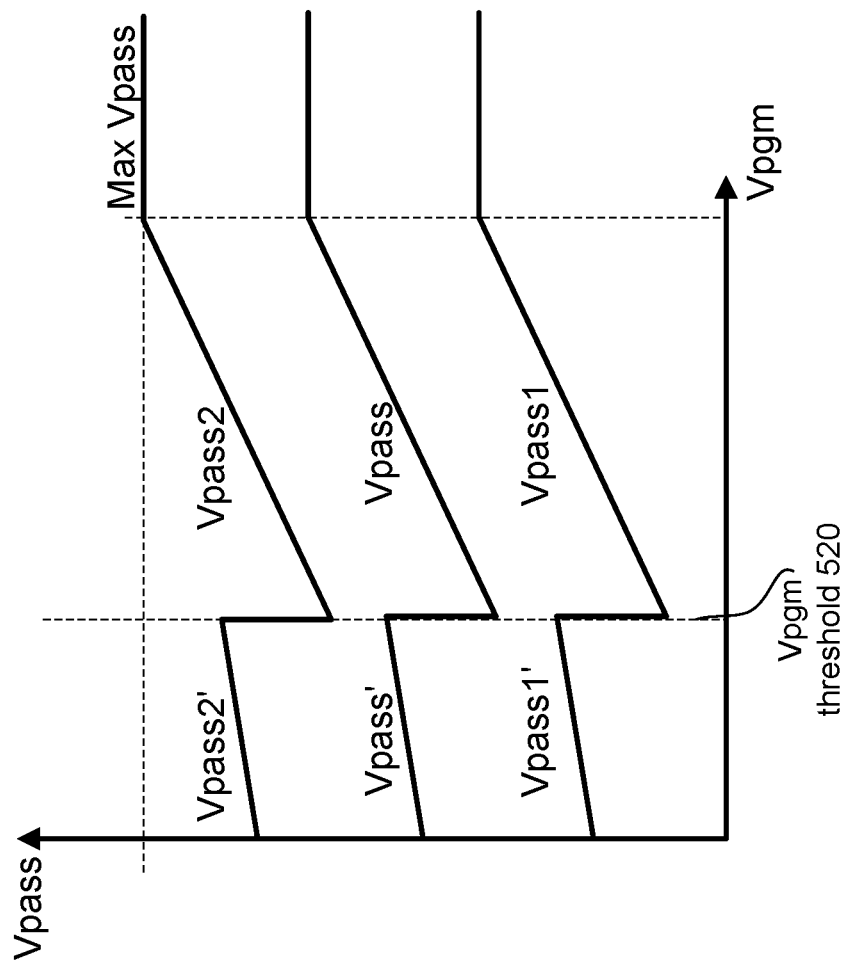
FIG. 7 is a graph of different pass voltages being compared between a pass voltage level and a program voltage level during a program operation in accordance with at least one embodiment.

FIG. 7 is a graph of different pass voltages being compared between a pass voltage level and a program voltage level during a program operation in accordance with at least one embodiment. This graph illustrates how multiple different higher pass voltages can be generated, including that are associated with Vpass, Vpass1 that is lower than Vpass, and Vpass2 that is higher than Vpass. In these embodiments, the Vpass1 pass voltage can be applied to one or more wordlines on the erase side of a selected wordline (WLn) and the Vpass2 pass voltage can be applied to one or more wordlines on the programmed side of the selected wordline (WLn). Further, the Vpass pass voltage is applied to a remainder of the wordlines other than the selected wordline and these one or more wordlines on the erase side and on the programmed side of the selected wordline (WLn).

More specifically, with additional reference to FIG. 6, at operation 640, the processing logic would instead add a base offset voltage to an initial pass voltage, to an initial first pass voltage, and to an initial second pass voltage, to respectively generate a higher pass voltage (Vpass'), a higher first pass voltage (Vpass1'), and a higher second pass voltage (Vpass2'). Then, at operation 650, the processing logic would cause the higher pass voltage to be applied to a subset of the plurality of wordlines other than the selected wordline; the higher first pass voltage to be applied to one or more wordlines that are adjacent to an erase side of the selected wordline, the higher first pass voltage being less than the higher pass voltage; and the higher second pass voltage to be applied to one or more wordlines that is adjacent to a programmed side of the selected wordline, the higher second pass voltage being greater than the higher pass voltage.

In these embodiments, the higher pass voltage, the higher first pass voltage, and the higher second pass voltage can each have a first increase rate. Then, at operation 660, the processing logic would detect, during programming associated with the selected wordline, that the program voltage satisfies the threshold program voltage. And, at operation 670, the processing logic would cause, in response to the detecting, the higher pass voltage, the higher first pass voltage, and the higher second pass voltage to each be reduced to a respective lower pass voltage that increases at a second increase rate. In some embodiments, the first increase rate is different than the second increase rate. In at least one embodiment, the first increase rate is zero and the second increase rate is positive. Further, in at least one embodiment, the first increase rate for each respective pass voltage level can vary to some degree and/or the second increase rate for each respective pass voltage level can vary to some degree.

Figure 8:
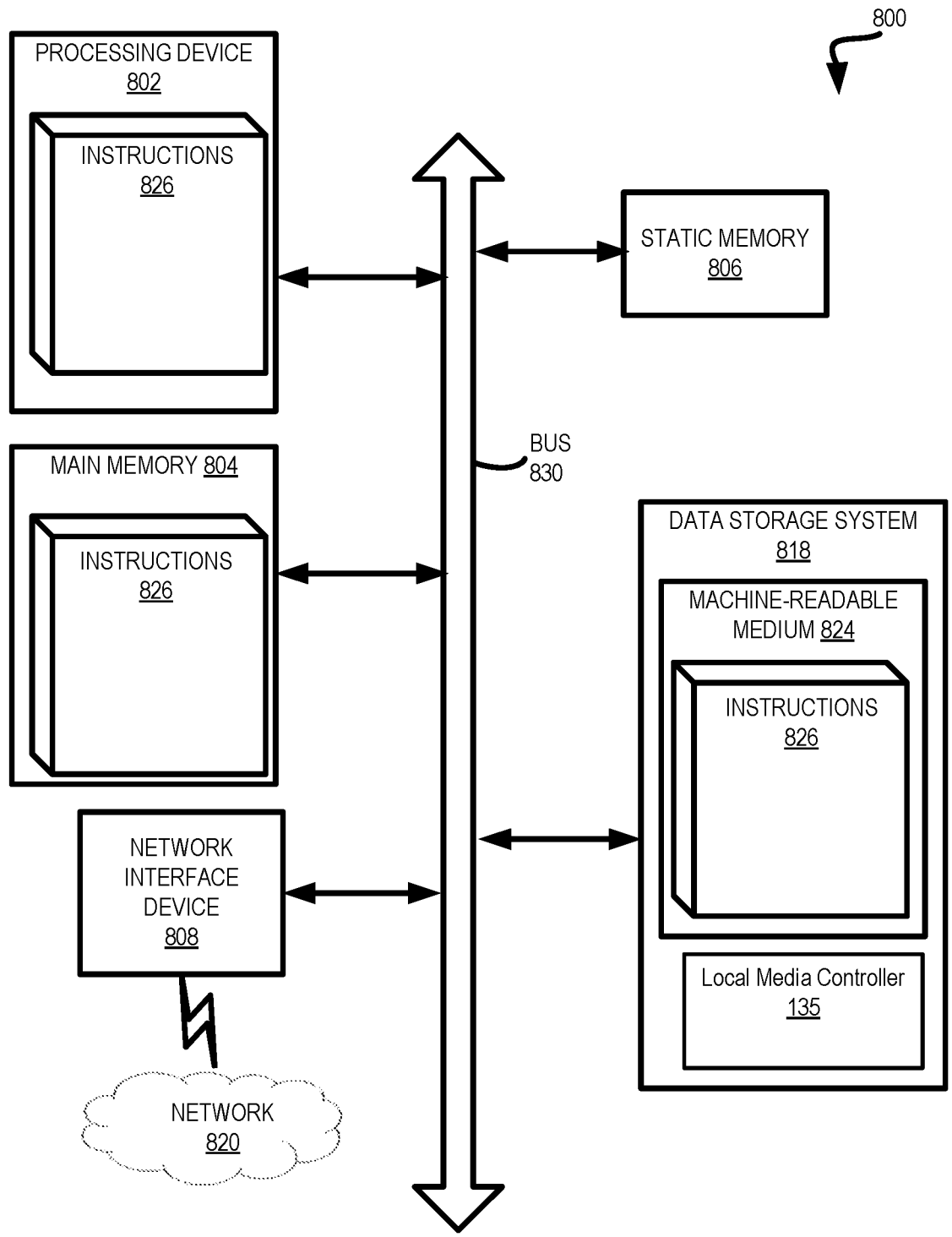
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the local media controller 135 of FIGS. 1A-1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1A.

In one embodiment, the instructions 826 include instructions to implement functionality corresponding to the local media controller 135 of FIGS. 1A-1B. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array; and
   control logic operatively coupled with the memory array, the control logic to perform operations comprising:
   detecting a program operation directed at a selected wordline of a plurality of wordlines of the memory array;
   determining, during an initial phase of the program operation, whether a program voltage being applied to the selected wordline satisfies a threshold program voltage;
   adding, in response to the program voltage not satisfying the threshold program voltage, a base offset voltage to an initial pass voltage to generate a higher pass voltage, the initial pass voltage being a percentage of an initial program voltage; and
   causing the higher pass voltage to be applied to unselected wordlines of the plurality of wordlines before programming one or more memory cells associated with the selected wordline.

2. The memory device of claim 1, wherein the higher pass voltage grows at a first increase rate, and wherein the operations further comprise:
   detecting, during programming associated with the selected wordline, that the program voltage satisfies the threshold program voltage; and
   causing, in response to the detecting, the higher pass voltage to be reduced to a lower pass voltage comprising the initial pass voltage growing at a second increase rate.

3. The memory device of claim 2, wherein the first increase rate is different than the second increase rate.

4. The memory device of claim 2, wherein the first increase rate is zero and the second increase rate is positive.

5. The memory device of claim 1, wherein the program operation follows directly after a program verify operation having been performed on the memory array.

6. The memory device of claim 1, wherein the program operation is a drain-to-source program operation of the memory array.

7. The memory device of claim 1, wherein the initial phase is of an inhibit program, which is intended to move electrons out of a source side of a channel of the memory array.

8. The memory device of claim 1, wherein a difference between the threshold program voltage and the initial program voltage is between 20-50% of a difference between a maximum program voltage and the initial program voltage to be applied to the selected wordline.

9. A method comprising:
   detecting a program operation directed at a selected wordline of a plurality of wordlines of a memory array;
   determining, during an initial phase of the program operation, whether a program voltage being applied to the selected wordline satisfies a threshold program voltage;
   adding, in response to the program voltage not satisfying the threshold program voltage, a base offset voltage to an initial pass voltage to generate a higher pass voltage, the initial pass voltage being a percentage of an initial program voltage; and
   causing the higher pass voltage to be applied to unselected wordlines of the plurality of wordlines before programming one or more memory cells associated with the selected wordline.

10. The method of claim 9, wherein the higher pass voltage grows at a first increase rate, the method further comprising:
    detecting, during programming associated with the selected wordline, that the program voltage satisfies the threshold program voltage; and
    causing, in response to the detecting, the higher pass voltage to be reduced to a lower pass voltage comprising the initial pass voltage growing at a second increase rate.

11. The method of claim 10, wherein the first increase rate is different than the second increase rate.

12. The method of claim 10, wherein the first increase rate is zero and the second increase rate is positive.

13. The method of claim 9, wherein the program operation follows directly after a program verify operation having been performed on the memory array.

14. The method of claim 9, wherein the program operation is a drain-to-source program operation of the memory array.

15. The method of claim 9, wherein the initial phase is of an inhibit program, which is intended to move electrons out of a source side of a channel of the memory array.

16. The method of claim 9, wherein a difference between the threshold program voltage and the initial program voltage is between 20-50% of a difference between a maximum program voltage and the initial program voltage to be applied to the selected wordline.

17. A memory device comprising:
    a memory array; and
    control logic operatively coupled with the memory array, the control logic to perform operations comprising:
    detecting a program operation directed at a selected wordline of a plurality of wordlines of the memory array;
    determining, during an initial phase of the program operation, whether a program voltage being applied to the selected wordline satisfies a threshold program voltage; and
    in response to the program voltage not satisfying the threshold program voltage:
      adding a base offset voltage to an initial pass voltage, to an initial first pass voltage, and to an initial second pass voltage, to respectively generate a higher pass voltage, a higher first pass voltage, and a higher second pass voltage;
      causing the higher pass voltage to be applied to a subset of the plurality of wordlines other than the selected wordline;
      causing the higher first pass voltage to be applied to one or more wordlines that are adjacent to an erase side of the selected wordline, the higher first pass voltage being less than the higher pass voltage; and
      causing the higher second pass voltage to be applied to one or more wordlines that are adjacent to a programmed side of the selected wordline, the higher second pass voltage being greater than the higher pass voltage.

18. The memory device of claim 17, wherein the higher pass voltage, the higher first pass voltage, and the higher second pass voltage each have a first increase rate, and wherein the operations further comprise:

detecting, during programming associated with the selected wordline, that the program voltage satisfies the threshold program voltage; and causing, in response to the detecting, the higher pass voltage, the higher first pass voltage, and the higher second pass voltage to each be reduced to a respective lower pass voltage that increases at a second increase rate.

19. The memory device of claim 18, wherein the first increase rate is different than the second increase rate.

20. The memory device of claim 18, wherein the first increase rate is zero and the second increase rate is positive.

* * * * *